(12) United States Patent
Gower et al.

(10) Patent No.: US 7,624,225 B2
(45) Date of Patent: Nov. 24, 2009

(54) SYSTEM AND METHOD FOR PROVIDING SYNCHRONOUS DYNAMIC RANDOM ACCESS MEMORY (SDRAM) MODE REGISTER SHADOWING IN A MEMORY SYSTEM

(75) Inventors: Kevin C. Gower, Lagrangeville, NY (US); Thomas J. Griffin, Salt Point, NY (US); Kirk D. Lamb, Kingston, NY (US); Dustin J. VanStee, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 417 days.

(21) Appl. No.: 11/689,647

(22) Filed: Mar. 22, 2007

(65) Prior Publication Data

US 2008/0235444 A1 Sep. 25, 2008

(51) Int. Cl.
*G06F 12/00* (2006.01)
(52) U.S. Cl. .................................................. 711/105
(58) Field of Classification Search ........................ None
See application file for complete search history.

(56) References Cited

U.S. PATENT DOCUMENTS 6,337,832 B1 * 1/2002 Ooishi et al. ........... 365/233.12
6,748,527 B1 * 6/2004 Utsumi et al. .................. 713/2
7,028,149 B2 * 4/2006 Grawrock et al. ........... 711/156

* cited by examiner

*Primary Examiner*—Hiep T Nguyen
(74) *Attorney, Agent, or Firm*—Cantor Colburn LLP

(57) ABSTRACT

A system and method for providing SDRAM mode register shadowing in a memory system. A system includes a memory interface device adapted for use in a memory system. The memory interface device includes an interface to one or more ranks of memory devices, and each memory device includes one or more types of mode registers. The memory interface device also includes an interface to a memory bus for receiving commands from a memory controller. The commands include a mode register set command specifying a new mode register setting for one or more ranks of memory devices and a mode register type. The memory interface device further includes a mode register shadow module to capture settings applied to the mode registers. The module includes a shadow register for each type of mode register and a shadow log for each type of mode register. The module also includes mode register shadow logic to detect a mode register set command, to store the new mode register setting in the shadow register corresponding to the specified mode register type, and to set one or more bits in the shadow log corresponding to the specified mode register type to indicate which of the ranks of memory devices have been programmed with the new mode register setting.

20 Claims, 11 Drawing Sheets

SYSTEM AND METHOD FOR PROVIDING SYNCHRONOUS DYNAMIC RANDOM ACCESS MEMORY (SDRAM) MODE REGISTER SHADOWING IN A MEMORY SYSTEM

BACKGROUND OF THE INVENTION

This invention relates generally to computer memory, and more particularly to providing synchronous dynamic random access memory (SDRAM) mode register shadowing in a memory system.

Contemporary high performance computing main memory systems are generally composed of one or more dynamic random access memory (DRAM) devices, which are connected to one or more processors via one or more memory control elements. Overall computer system performance is affected by each of the key elements of the computer structure, including the performance/structure of the processor(s), any memory cache(s), the input/output (I/O) subsystem(s), the efficiency of the memory control function(s), the main memory device(s), and the type and structure of the memory interconnect interface(s).

Extensive research and development efforts are invested by the industry, on an ongoing basis, to create improved and/or innovative solutions to maximizing overall system performance and density by improving the memory system/subsystem design and/or structure. High-availability systems present further challenges as related to overall system reliability due to customer expectations that new computer systems will markedly surpass existing systems in regard to mean-time-between-failure (MTBF), in addition to offering additional functions, increased performance, increased storage, lower operating costs, etc. Other frequent customer requirements further exacerbate the memory system design challenges, and include such items as ease of upgrade and reduced system environmental impact (such as space, power and cooling).

To achieve the wide range of performance, density and reliability objectives, as well as to achieve aggressive time-to-market goals in the competitive systems market, developers often add features and/or "hooks" to facilitate fault diagnosis during system bring-up and characterization. Ideally, any added features will offer benefits both prior to and after systems are introduced to the marketplace, including such benefits as enhanced/rapid fault diagnosis, reduced power-up time, simplified operational adjustments to varying environmental conditions, etc.

FIG. 1 relates to U.S. Pat. No. 5,513,135 to Dell et al., of common assignment herewith, and depicts an early synchronous memory module. The memory module depicted in FIG. 1 is a dual in-line memory module (DIMM). This module is composed of synchronous DRAMs 8, buffer devices 12, an optimized pinout, and an interconnect and capacitive decoupling method to facilitate high performance operation. The patent also describes the use of clock re-drive on the module, using such devices as phase-locked loops (PLLs).

FIG. 2 relates to U.S. Pat. No. 6,173,382 to Dell et al., of common assignment herewith, and depicts a computer system 10 which includes a synchronous memory module 220 that is directly (i.e. point-to-point) connected to a memory controller 14 via a bus 240, and which further includes logic circuitry 24 (such as all application specific integrated circuit, or "ASIC") that buffers, registers or otherwise acts on the address, data and control information that is received from the memory controller 14. The memory module 220 can be programmed to operate in a plurality of selectable or programmable modes by way of an independent bus, such as an inter-integrated circuit (I2C) control bus 34, either as part of the memory initialization process or during normal operation. When utilized in applications requiring more than a single memory module connected directly to a memory controller, the patent notes that the resulting stubs can be minimized through the use of field-effect transistor (FET) switches to electrically disconnect modules from the bus.

Relative to U.S. Pat. No. 5,513,135, U.S. Pat. No. 6,173,382 further demonstrates the capability of integrating all of the defined functions (address, command, data, presence detect, etc) into a single device. The integration of functions is a common industry practice that is enabled by technology improvements and, in this case, enables additional module density and/or functionality.

FIG. 3, from U.S. Pat. No. 6,587,912 to Bonella, et al., depicts a synchronous memory module 210 and system structure in which the repeater hubs 320 include local re-drive of the address, command and data to the local memory devices 301 and 302 via buses 321 and 322; generation of a local clock (as described in other figures and the patent text); and the re-driving of the appropriate memory interface signals to the next module or component in the system via bus 300.

FIG. 4 depicts a contemporary system composed of an integrated processor chip 400, which contains one or more processor elements and an integrated memory controller 410. In the configuration depicted in FIG. 4, multiple independent cascade interconnected memory interface busses 406 are logically aggregated together to operate in unison to support a single independent access request at a higher bandwidth with data and error detection/correction information distributed or "striped" across the parallel busses and associated devices. The memory controller 410 attaches to four narrow/high speed point-to-point memory busses 406, with each bus 406 connecting one of the several unique memory controller interface channels to a cascade interconnect memory subsystem 403 (or memory module) which includes at least a hub device 404 and one or more memory devices 409. Some systems further enable operations when a subset of the memory busses 406 are populated with memory subsystems 403. In this case, the one or more populated memory busses 406 may operate in unison to support a single access request.

FIG. 5 depicts a memory stricture with cascaded memory modules 503 and unidirectional busses 506. One of the functions provided by the hub devices 504 in the memory modules 503 in the cascade structure is a re-drive function to send signals on the unidirectional busses 506 to other memory modules 503 or to the memory controller 510. FIG. 5 includes the memory controller 510 and four memory modules 503, on each of two memory busses 506 (a downstream memory bus with 24 wires and an upstream memory bus with 25 wires), connected to the memory controller 510 in either a direct or cascaded manner. The memory module 503 next to the memory controller 510 is connected to the memory controller 510 in a direct manner. The other memory modules 503 are connected to the memory controller 510 in a cascaded manner. Although not shown in this figure, the memory controller 510 may be integrated into a processor and may connect to more than one memory bus as depicted in FIG. 4.

In a memory subsystem, a memory interface device (MID) (e.g., for providing an interface between a memory controller and SDRAM devices) will have sections of its logic that need to be configured to match the programming of the SDRAM device(s) mode register settings (this is referred to as the MID's SDRAM-dependent configuration). There is some overall inefficiency, as well as potential for error if this configuration needs to get programmed twice: once for the SDRAM via mode register set commands, and then again for the MID. Additionally, since the SDRAM mode register contents can not be read back, any memory subsystem failure due to unmatched configuration between the MID and a SDRAM can be difficult to diagnose. This difficulty increases with the number of ranks of SDRAM devices that the MID controls.

Whereas initial synchronous memory devices included only a single mode register, with limited programmable functions/attributes, emerging SDRAMs (such as DDR3 and DDR4) include four or more mode registers (e.g. MR0 through MR3) that correspond to extensive programmable memory device features affecting functionality, performance, drive characteristics, I/O terminations, power dissipation, refresh, temperature sensing, etc. The increase in mode register size and complexity, in conjunction with the current need to program all memory devices as well as MIDs in the system, results in increased system debug time (initial system evaluation, analysis and/or test escapes (e.g. all possible combinations may not be tested and/or may not be testable at the time of system shipment)) and a significant startup time increase.

It would be desirable to provide an efficient process for allowing MIDs to monitor the programming of SDRAM mode registers. Ideally this process would include having the same mode register set command(s) and associated configuration data being applied to both the MID and the SDRAM registers.

BRIEF SUMMARY OF THE INVENTION

An embodiment includes a memory interface device adapted for use in a memory system. The memory interface device includes an interface to one or more ranks of memory devices, and each memory device includes one or more types of mode registers. The memory interface device also includes an interface to a memory bus for receiving commands from a memory controller. The commands include a mode register set command specifying a new mode register setting for one or more ranks of memory devices and a mode register type. The memory interface device further includes a mode register shadow module to capture settings applied to the mode registers. The module includes a shadow register for each type of mode register and a shadow log for each type of mode register. The module also includes mode register shadow logic to detect a mode register set command, to store the new mode register setting in the shadow register corresponding to the specified mode register type, and to set one or more bits in the shadow log corresponding to the specified mode register type to indicate which of the ranks of memory devices have been programmed with the new mode register setting.

Another embodiment includes a method for providing mode register shadowing at a memory interface device that interfaces to one or more ranks of memory devices, each memory device including one or more types of mode registers. The method includes detecting a mode register set command, the mode register set command specifying: a new mode register setting; one of the ranks of memory devices; and one of the mode register types. The new mode register setting is stored in a shadow register corresponding to the mode register type. One or more bits in a shadow log corresponding to the mode register type are set to indicate which of the ranks of memory devices have been programmed with the new mode register setting.

Another embodiment includes a memory system for storing and retrieving data. The memory system includes one or more ranks of memory devices, each memory device including one or more types of mode registers. The memory system also includes a memory controller for generating memory commands, a memory bus in communication with the memory controller, and a memory hub device. The commands generated by the memory controller include a mode register set command specifying a mode register type and a new mode register setting for memory devices in a specified rank. The memory hub device includes an interface to the one or more ranks of memory devices, an interface to the memory bus for receiving the commands from the memory controller, and a mode register shadow module to track settings applied to the mode registers. The module includes a shadow register for each type of mode register and a shadow log for each type of mode register. The module also includes mode register shadow logic to detect a mode register set command, to store the new mode register setting in the shadow register corresponding to the specified type, and to set one or more bits in the shadow log corresponding to the specified mode register type to indicate which of the ranks of memory devices have been programmed with the new mode register setting.

A further embodiment includes a memory subsystem that includes one or more ranks of memory devices, each memory device including one or more types of mode registers, a memory bus for receiving commands from a memory controller and a memory hub device. The commands received from the memory controller include a mode register set command specifying a mode register type and a new mode register setting for memory devices in a specified rank. The memory hub device includes an interface to the one or more ranks of memory devices and to the memory bus, and a mode register shadow module to capture settings applied to the mode registers. The module includes a shadow register for each type of mode register and a shadow log for each type of mode register. The module also includes mode register shadow logic to detect a mode register set command received on the memory bus, to store the new mode register setting in the shadow register corresponding to the specified mode register type, and to set one or more bits in the shadow log corresponding to the specified mode register type to indicate which of the ranks of memory devices have been programmed with the new mode register setting.

Other systems, methods, and/or computer program products according to embodiments will be or become apparent to one with skill in the art upon review of the following drawings and detailed description. It is intended that all such additional systems, methods, and/or computer program products be included within this description, be within the scope of the present invention, and be protected by the accompanying claims.

BRIEF DESCRIPTION OF THE DRAWINGS

Referring now to the drawings wherein like elements are numbered alike in the several FIGURES.

DETAILED DESCRIPTION OF EXEMPLARY EMBODIMENTS

Figure 1:
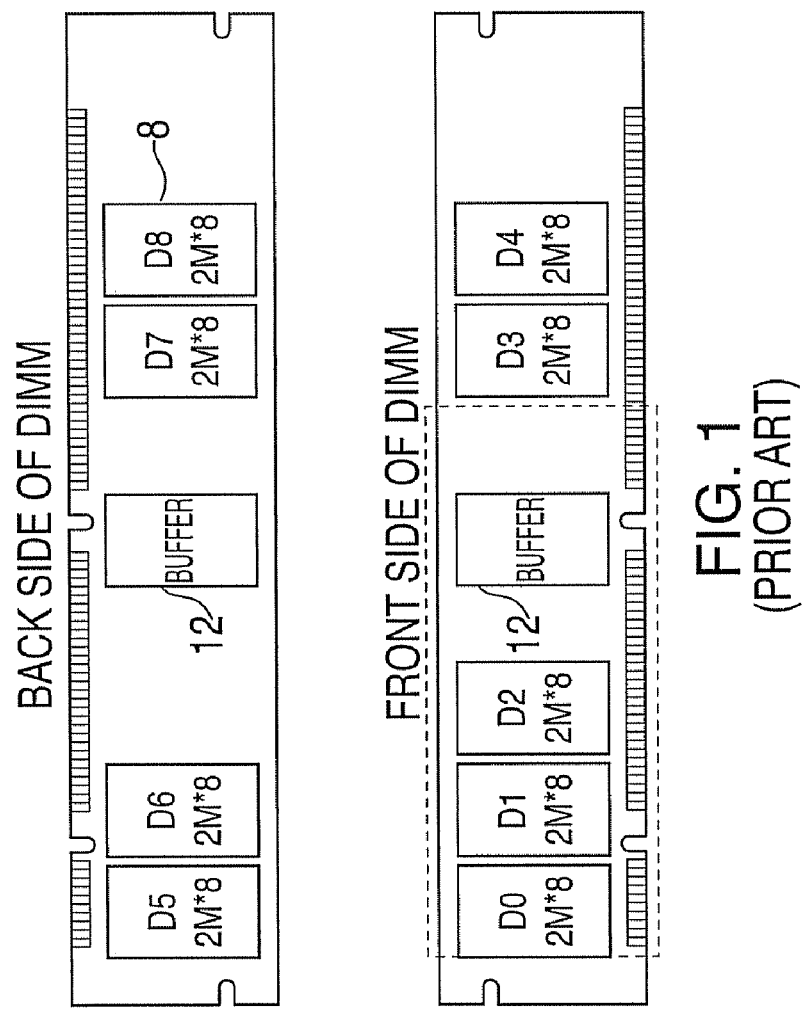
FIG. 1 depicts an exemplary early synchronous memory module.
Figure 2:
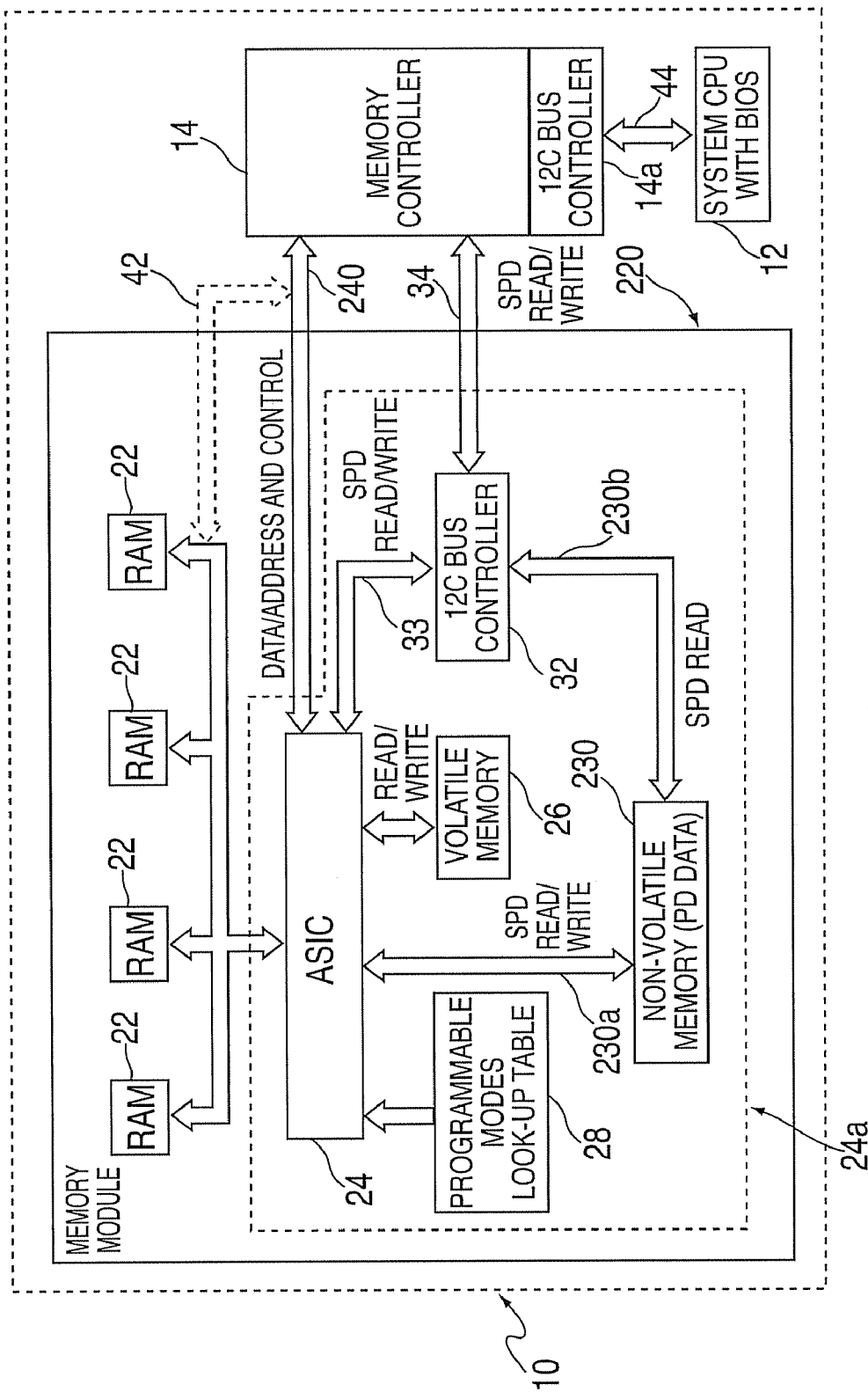
FIG. 2 depicts an exemplary computer system with a fully buffered synchronous memory module that is directly connected to a memory controller.
Figure 3:
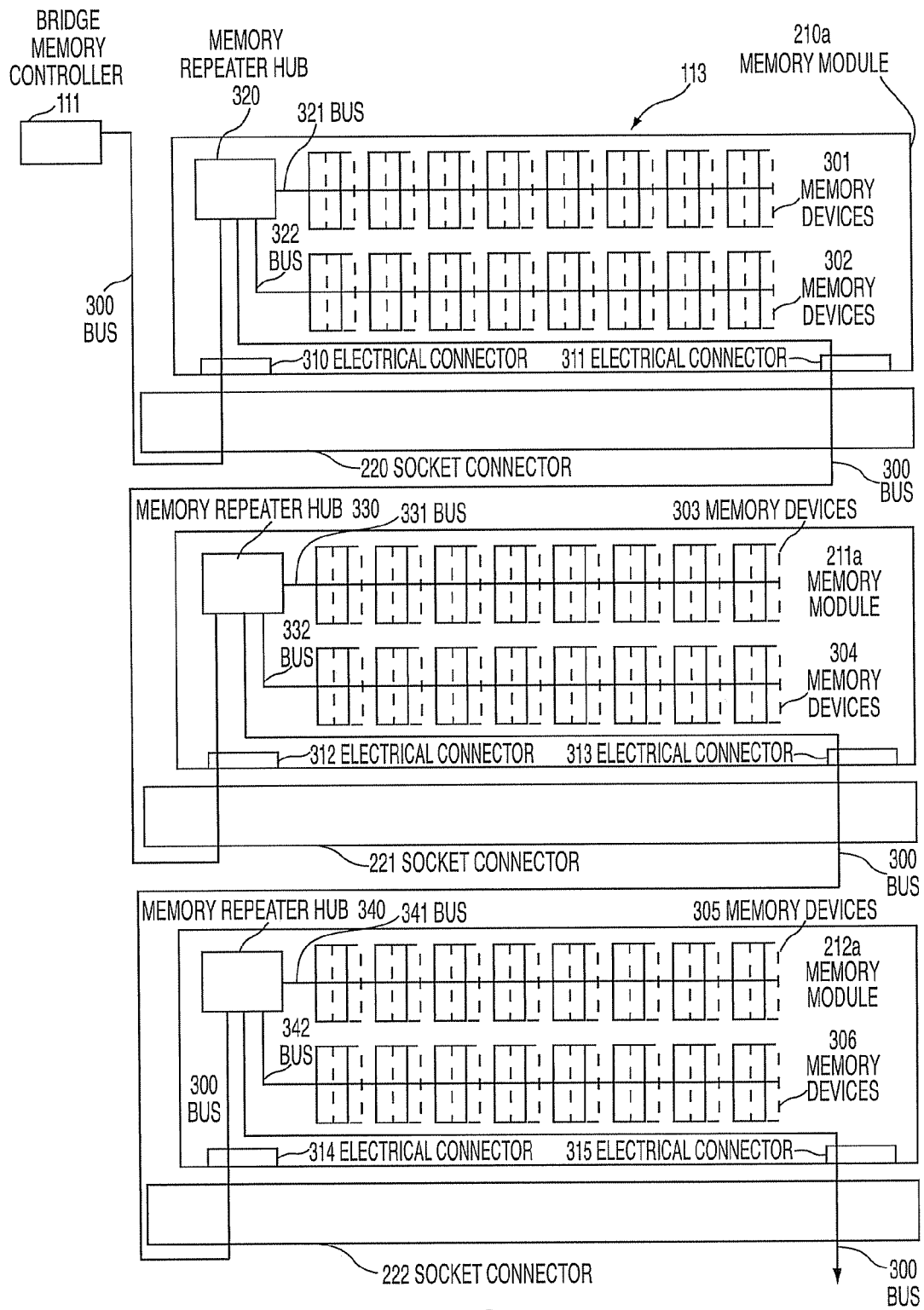
FIG. 3 depicts a fully buffered synchronous memory module and system structure, where the fully buffered synchronous memory module includes a repeater function.
Figure 4:
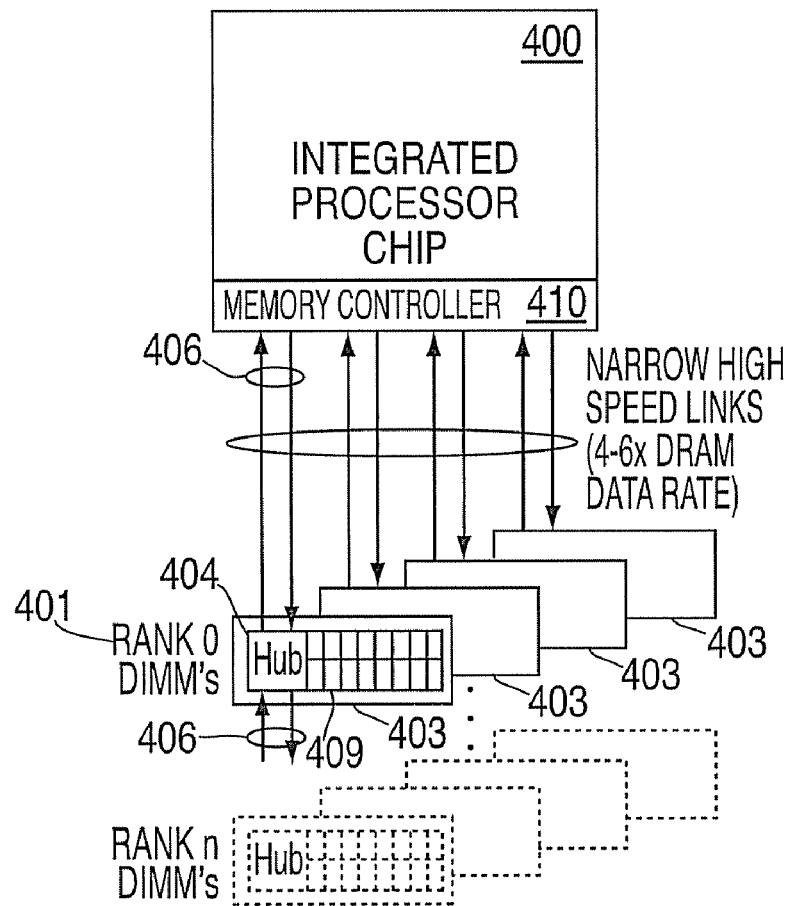
FIG. 4 depicts a block diagram of a computer memory system which includes multiple independent cascade interconnect memory interface busses that operate in unison to support a single data access request.

Exemplary embodiments described herein store the contents of mode register set commands at a memory interface device (MID) in an efficient manner by using one or more shadow register(s) corresponding to the mode registers located on the memory device(s). The contents of the shadow register(s) may be queried to determine current values in the corresponding mode registers located on the memory devices. The MID traps the mode register set commands received from a memory controller, processor or other device(s) which may configure the one or more memory subsystems (e.g. DIMMs) and utilizes the mode register set commands to program a portion of its programmable attributes, thus decreasing the chance of error due to a mismatch between the configuration of the MID and the memory devices. If the MID is in communication with a single rank of memory devices with the same configurations and all having four mode registers, the exemplary MID would have four shadow registers, one for each mode register. When the MID is in communication with two or more ranks of memory all having the same configuration and having four mode registers, the exemplary MID would have four shadow registers and four shadow rank logs with one bit for each rank to track the current contents of the mode registers on the memory devices.

There is a need for the MID to monitor the programming of the SDRAM mode register(s). This would reduce system configuration overhead in the case where the MID uses at least a portion of this information for its own SDRAM-dependent configuration. By monitoring the programming of the SDRAM mode register(s) for each rank of memory, the MID has direct knowledge of whether or not the SDRAM mode register(s) for each rank of memory has been programmed, and whether or not it is properly programmed in relation to each rank for the set of SDRAM-dependent configuration data. This capability becomes a powerful diagnostic tool during memory subsystem failure diagnosis and the identification of possible corrective action(s). Further, the MID may need to locally modify SDRAM configurations, from the initial settings, based on information known to the MID (e.g. local device temperature(s), etc.) or may modify interface timings, signal preconditioning, interface voltages, etc, for the MID or SDRAM(s), to maximize attributes such as the memory data valid eye (e.g. the period of time that the data is valid in addition to the amplitude of the data). For a multi-rank memory subsystem, it is desirable for the MID to track each rank's mode register programming in an efficient manner.

One manner of monitoring/recording mode register commands to memory devices for failure diagnosis purposes is to utilize firmware tracing of the processor/controller that drives the MID (generally software-driven and executed via the memory controller). This method provides a means for tracking mode register set ([E]MRS) commands (consisting of one or more of the mode register and extended mode register settings, as applicable for a given application); however, there are shortcomings and difficulties using this approach for memory failure diagnosis. Firmware tracing at the processor/controller is multiple levels removed from the memory command bus interface and is therefore incapable of identifying/addressing a wide range of hardware failures between the processor/controller and the memory devices themselves. Additionally, since a memory failure event will most likely happen well after a bad mode register set [E]MRS command, a firmware trace may not capture the bad [E]MRS command, and if it does, significant work is required to parse the trace file in order to find the failure event. A pre-defined filter may shorten the trace, but further effort is required to set the filter correctly, and this debug method is generally useful only for reproducible failures. This solution does not address the need to program the mode register configuration in both the SDRAM and MID, is not useful for non-reproducible failures and does not provide a means of locally capturing initial settings and/or failure data such that this critical information can be stored using a non-volatile memory means and returned with the failing memory subsystem.

Another way to monitor/record mode register commands to memory devices for failure diagnosis is to perform hardware tracing of the memory command bus (e.g. via external test equipment and/or trace arrays in the MID). This method moves the tracing capability closer to the hardware of interest and as such, offers an advantage over the method discussed previously. However, relative to the previously discussed method of monitoring/recording mode register commands this solution is even less likely to capture a bad [E]MRS command associated with a memory failure because of array storage limitations. Failures may not occur until after a very large number of memory operations have occurred subsequent to the memory device mode register(s) being set. This solution further presents significant difficulties in regard to probing high speed interfaces, especially in a system environment—without creating failures due to the bus loading effects related to the probing, and has the same issues with pre-defined filtering as described above with reference to the previous method. This solution also does not address the need to program mode register configuration data in both the SDRAM(s) and the memory interface device(s).

As used herein, the term "mode registers" refers to a group of registers in a SDRAM device that are used to control the various operating modes of the SDRAM. The mode registers include the first mode register (also referred to herein as the "mode register") and any extended mode registers in the SDRAM device. As used herein the term "mode register set", abbreviated as "MRS" refers to the SDRAM commands that program the values in the first mode register. As used herein the term "extended mode register set", abbreviated as "[E]MRS", refers to the SDRAM commands that program the values in the first mode register as well as the values in any extended mode registers. As used herein, the term "memory interface device", abbreviated as "MID", refers to a device (consisting of one or more integrated circuits or chips) that serves as the interface between a processor or controller and one or more SDRAM devices. When used as a standalone device, the MID has also been referred to as a memory "bus converter" or "hub." When used as an integrated component on a memory module or subsystem, the MID has also been referred to as a "buffer", or a "hub" or a "register." As used herein, the term "rank" refers to a collection of SDRAM devices arranged in parallel, so as to define a memory word width, the SDRAM devices all sharing a common chip select signal from the MID. As used herein, the term "memory subsystem" refers to the combination of a MID and one or more ranks of SDRAM devices. As used herein, the term "SDRAM dependent configuration" refers to a MID configuration that is a function of SDRAM mode register settings.

Exemplary embodiments as described herein utilize mode register shadow logic to trap [E]MRS commands directed to the memory device(s). In a multi-rank (or single rank) contemporary memory subsystem built with industry standard synchronous memory devices (e.g., SDRAMs), the processor/controller to memory command set will include a set of [E]MRS commands that program the SDRAM mode register settings. The set of [E]MRS commands may program the SDRAM mode register settings for the entire memory or for portions of the memory (such as on a per-rank basis). These settings are monitored and tracked in a storage-efficient (or compressed) manner in which the MID always traps, for a given [E]MRS register, the last copy of the mode register settings written to memory. The MID copies the settings into a shadow register and maintains a log indicator for each rank. In an exemplary embodiment the shadow register contains the last copy of mode register settings written to memory, in an alternate exemplary embodiment, the shadow register also includes one or more previous mode register settings that were written to memory—which may further facilitate failure diagnosis.

In an exemplary embodiment, a shadow register and accompanying set of rank log bits in a shadow log(s) is retained for each set of mode registers for the SDRAM(s) within a memory rank. For a given [E]MRS shadow register, a "set log bit" for a given rank, indicates that the memory device(s) in the rank have been programmed according to the contents of the shadow register. A given log bit is set when the current [E]MRS command is received and decoded as being directed to a particular rank. If a new [E]MRS command is decoded as being directed to a memory rank or ranks, other than a given rain "X" that had been previously programmed (and its log bit previously set), then rank X's log bit remains set only if data comparison indicates there is no change to the [E]MRS shadow register contents. If the data comparison indicates that newly received mode register command will result in a change to the [E]MRS shadow register contents, then the log bits corresponding to previously set ranks is reset to "0" to indicate that the new contents of the shadow register do not reflect what was written to the previously set ranks.

If all memory devices (including, therefore, all memory ranks) in a memory subsystem have, for each mode register type, mode register values that are programmed with the same values, then all of the rank log bits for each [E]MRS shadow register would be set by the completion of the SDRAM initialization process. In an exemplary embodiment, after initialization is complete, the memory controller checks the rank log bits. If one of the rank log bits is a zero, then the memory controller identifies a potential error and can resend the [E]MRS commands to all or a portion of the memory devices attached to the MID or perform some other error mitigation action.

The mode register shadowing is enabled or disabled via a configuration setting in the MID. In an exemplary embodiment, the shadow registers can also be updated through register write commands. In the case where mode register shadowing is disabled but the MID uses the shadow registers for its SDRAM-dependent configuration, register write commands are used to properly set the shadow registers; thereby also setting the related MID registers.

With [E]MRS shadow registers designed as just described in exemplary embodiments, the mode register settings are available to be used as the basis for MID SDRAM-dependent configuration settings so that at least those common areas in the MID configuration registers no longer need to be programmed in addition to the SDRAM mode registers. In addition, the SDRAM mode register settings (or more precisely, the settings previously received and forwarded to the SDRAM device(s)) are readily available by reading the MID shadow registers. (The SDRAM mode registers are not directly readable using previous and contemporary SDRAMs.) The log bits in the shadow log(s) indicate which ranks have their SDRAM mode registers set according to the shadow register contents. This facilitates confirmation that attached memory devices have been configured (e.g. at power-up and/or at a later time during operation) as well as memory failure diagnosis when the mode register settings need to be confirmed. This is an advantage over the known tracing solutions that require pre-filtering (plus work to properly set the filter), and/or sufficient storage to capture a bad [E]MRS command. The tracing solutions also require parsing (collecting and analysis) of trace files which is not required by exemplary embodiments described herein.

In an alternate exemplary embodiment, a set of shadow registers is maintained for each memory rank. In a memory subsystem containing four ranks this would require four times as many shadow registers as described in the previous example where mode register settings in memory devices across ranks are intended to be the same. Each shadow register has an accompanying log bit indicating whether that particular mode register for that rank was written. This configuration allows, for a given mode register type, unique programming of mode register values for each memory rank. This flexibility requires more storage elements for the additional shadow registers. Uniquely programmed mode register values per memory rank also implies more logic in the MID to support such features as unique memory latency and bandwidth per rank.

Figure 6:
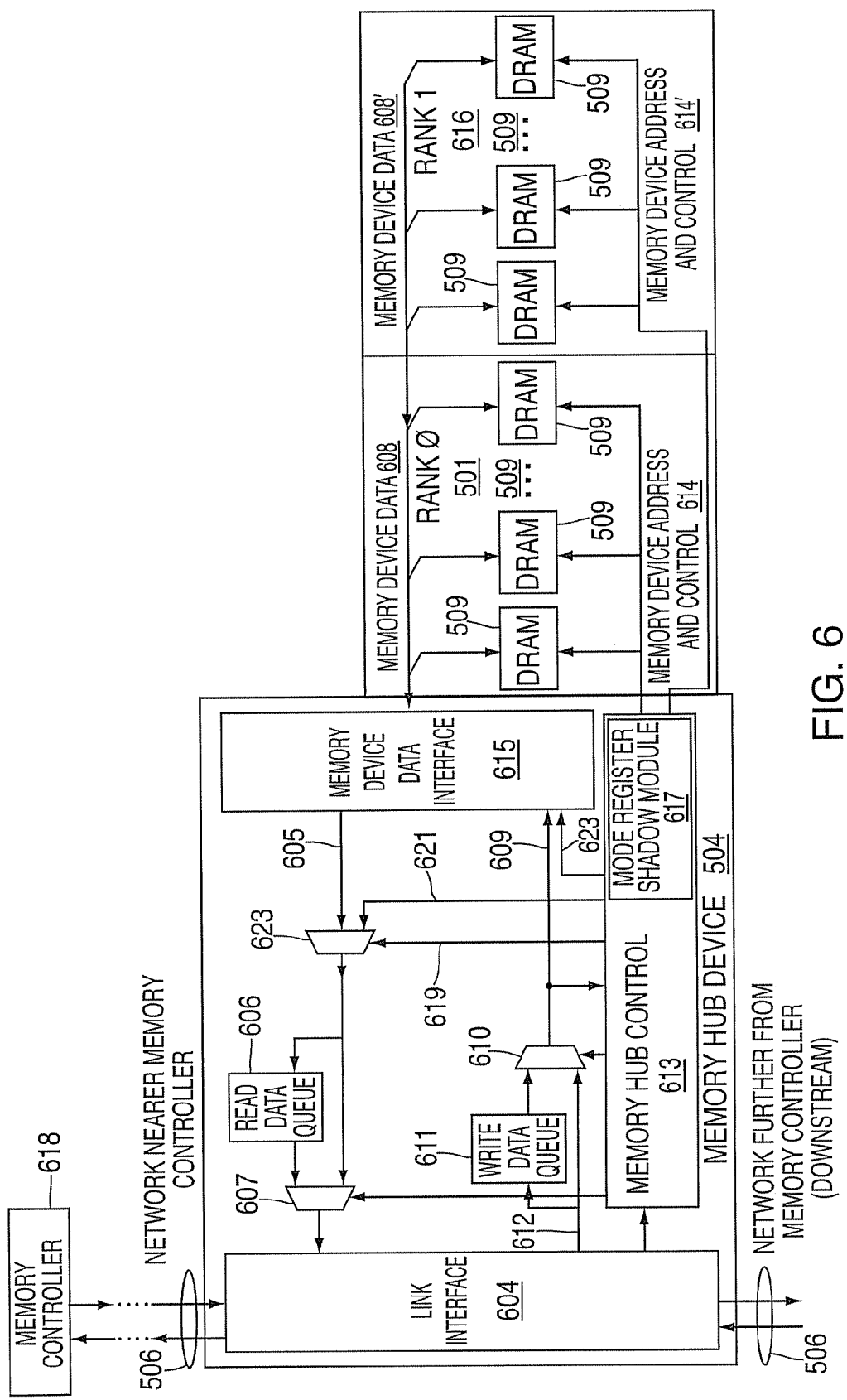
FIG. 6 is a block diagram of a hub device with a mode register shadow module in a memory subsystem that may be implemented by an exemplary embodiment.

FIG. 6 is a block diagram of a hub device 504 (a type of MID) in a memory system that may be implemented by exemplary embodiments. The hub device 504 includes a mode register shadow module 617 for tracking settings applied to the mode registers. FIG. 6 depicts a block diagram of a memory hub device 504 including a link interface 604 for providing the means to re-synchronize, translate and re-drive high speed memory access information to associated DRAM devices 509 and/or to re-drive the information downstream on memory bus 506 as applicable based on the memory system protocol. The information is received by the link interface 604 from an upstream memory hub device 504 or from a memory controller 618 (directly or via an upstream memory hub device 504) via the memory bus 506. The memory device data interface 615 manages the technology-specific data interface with the memory devices 509 and controls the bi-directional memory data bus 608. The memory hub control 613 responds to access request packets by responsively driving the memory device 509 technology-specific address and control bus 614 (for memory devices in RANK0 501) or address and control bus 614' (for memory devices in RANK1 616) and directing the read data flow 607 and write data flow 610 selectors. The address and control buses 614 614' are also referred to herein as an interface to the one or more ranks of memory devices 509. In exemplary embodiments described herein each of the memory devices 509 has one or more mode registers (e.g., the first mode register and an extended mode registers), described herein as one or more mode register types (e.g. mode register 0 (MR0), mode register 1 (MR1), etc). Mode register set commands, as described herein are also received via the memory bus 506, and in exemplary embodiments they specify a current mode register setting for a specified rank of memory devices as well as the target mode register type.

The link interface 604 in FIG. 6 decodes the packets and directs the address and command information directed to the local hub device 504 to the memory hub control 613. Memory write data from the link interface 604 can be temporarily stored in the write data queue 611 or directly driven to the memory devices 509 via the write data flow selector 610 and internal bus 612, and then sent via internal bus 609 and memory device data interface 615 to memory device data bus 608. Memory read data from memory device(s) 509 can be queued in the read data queue 606 or directly transferred to the link interface 604 via internal bus 605 and read data selector 607, to be transmitted on the upstream bus 506 as a read reply packet.

The memory hub control 613 depicted in FIG. 6 includes a mode register shadow module 617. In an exemplary embodiment, the mode register shadow module 617 includes one or more shadow registers, one or more shadow logs (e.g., shadow rank logs or shadow write logs), an input port for receiving copies of the decoded packets received at the memory hub control 613, and mode register shadow logic. The mode register shadow module 617 is utilized to provide the SDRAM mode register shadowing described herein. Bus 621 is utilized by the memory hub device (MID) 504 during read operations to the mode register shadow module, to multiplex (via multiplexer 623) mode register shadow contents onto internal read bus 605. Control line 619 is used to select the multiplexer input, based on the received command. During write operations to the mode register shadow module 617, all or a portion of the data contents of bus 609 are written to the mode register shadow module 617, consistent with the command received on bus 506. During write operations to the mode register shadow module 617, drivers in the memory device data interface 615 to data bus 608 may be disabled via control signal(s) 623.

Figure 7:
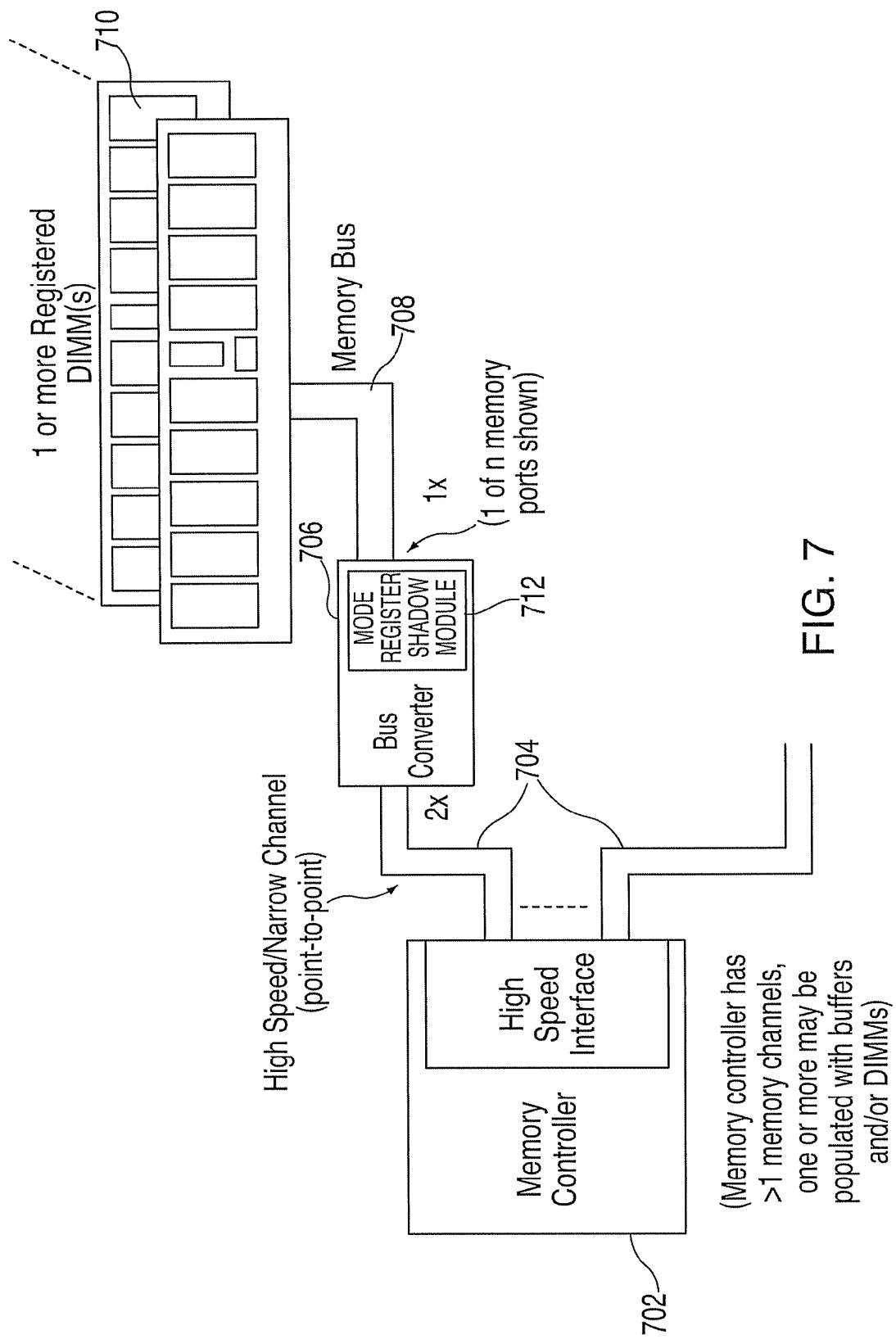
FIG. 7 depicts a memory subsystem with point-to-point channels, registered DIMMs, a 2:1 bus speed multiplier, and a mode register shadow module that may be implemented by an exemplary embodiment.

FIG. 7 depicts a memory subsystem that may be implemented by exemplary embodiments. The memory subsystem in FIG. 7 includes a memory controller 702, one or more high speed point-to-point channels 704, each connected to a bus-to-bus converter chip 706 (an example of a MID), and each having a synchronous memory interface 708 that enables connection to one or more registered or unbuffered DIMMs 710. In this implementation, the high speed, point-to-point channel 704 operates at twice the DRAM data rate, with information passed to the MID in the form of packetized data, allowing the bus-to-bus converter chip 706 to operate one or two DIMM memory channels at the full DRAM data rate. In exemplary embodiments, each of the DIMMs 710 includes a PLL, registers, DRAMs, all electrically erasable programmable read-only memory (EEPROM) and terminators, in addition to other active or passive components. Other exemplary embodiments may operate the high speed channel 704 at four times the DRAM data rate, or at other speed ratios optimally suited for a particular application, and the information transferred may be in a parallel or packetized format.

The bus converter 706 in FIG. 7 includes a mode register shadow module 712. In an exemplary embodiment, the mode register shadow module 712 includes one or more shadow registers, one or more shadow logs (e.g., shadow rank logs or shadow write logs), an input port for accessing memory commands received from the memory controller 702 (or other controlling system), and mode register shadow logic. The mode register shadow logic performs the mode register shadowing/tracking functions described herein. The mode register shadow module 712 is utilized to provide the SDRAM mode register shadowing described herein.

Figure 5:
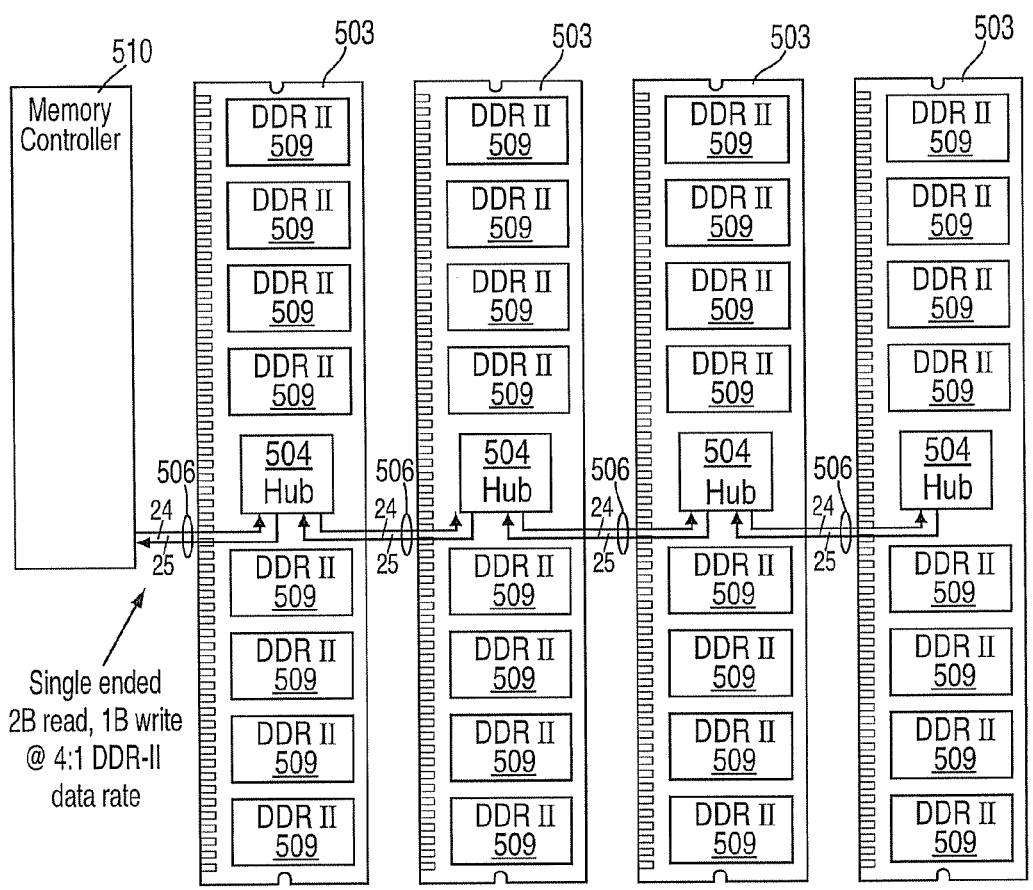
FIG. 5 depicts a memory structure with cascaded memory modules and unidirectional busses.

As depicted in FIG. 7, the mode register shadow module 712 is located on a MID that is a bus converter 706. In exemplary embodiments, the bus converter 706 is implemented by the memory hub device 504 depicted in FIG. 6. Thus, the memory hub device 504 (also referred to herein as a "buffer device") depicted in FIG. 6 is not integrated on a buffered memory module such as those depicted in FIG. 5. In this exemplary embodiment, the parallel interface of the hub device 504 (utilized to communicate with the memory devices 509 in FIG. 6) is utilized to communicate with registered or unbuffered DIMMs 710. The mode register shadow module 712 described herein supports both the configuration depicted in FIG. 6 and the configuration depicted in FIG. 7.

Figure 8:
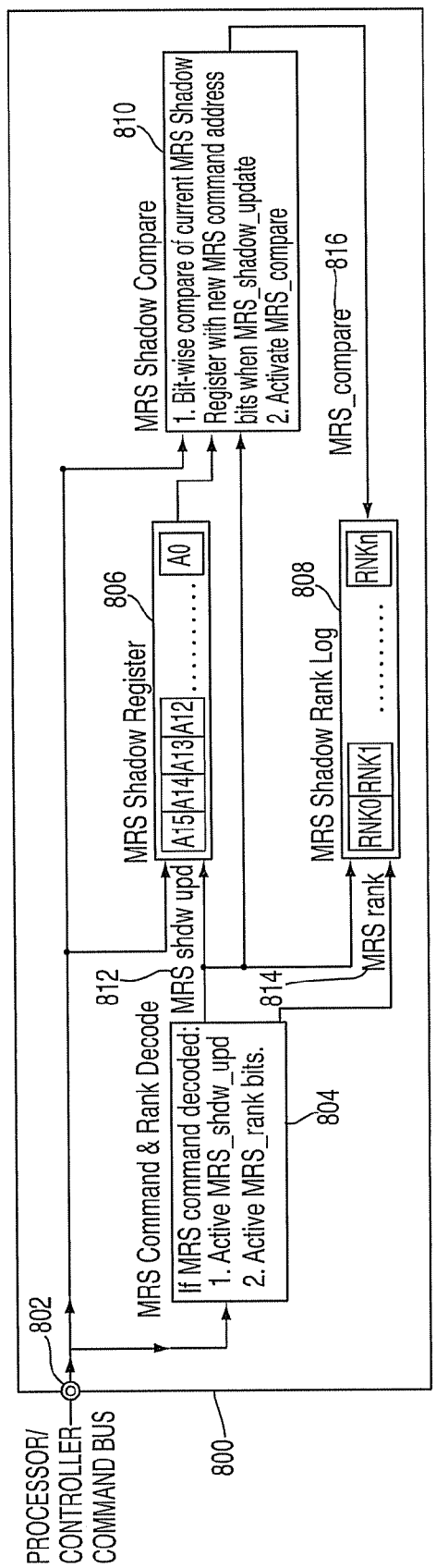
FIG. 8 is a block diagram of a mode register shadow module with rank logging that may be implemented by an exemplary embodiment.

FIG. 8 is a block diagram of a mode register shadow module 800 with rank logging that may be implemented by an exemplary embodiment to track settings applied to the mode registers in the memory devices 509. In the exemplary embodiment depicted in FIG. 8, one set of shadow registers 806 applies to more than one rank of memory. A single shadow register 806 and accompanying shadow rank log 808 (also referred to herein as a "shadow log") is present for each mode register type in the memory device(s). FIG. 8 depicts details for a single [E]MRS shadow register (e.g., as related to DRAM mode register 0 (MR0)). The mode register shadow logic includes the MRS command and rank decode logic 804 that identifies and decodes any [E]MRS commands received at the input port 802 from the incoming processor/controller command bus from link interface 604. Copies of the commands from the memory controller are received at the input port 802 after the contents of the bus have been validated and/or corrected via a CRC/re-try, ECC or other validation and/or correction method. The mode register shadow module 800 monitors the commands being received from the memory controller/processor and does not interrupt the processing of these commands by the hub device 504. The MRS command and rank decode logic 804 activates a MRS_shdw_upd indicator signal 812 to indicate that an [E]MRS command has been received/detected for a particular mode register type. The MRS command and rank decode logic 804 also decodes and drives rank decode bits, MRS_rank indicator signals 814, which identify the memory rank(s) affected by the MRS command.

Another component of the mode register shadow logic is the MRS shadow compare logic 810 depicted in FIG. 8. The MRS shadow compare logic 810 uses the MRS_shdw_upd indicator signal 812 to compare the current shadow register values with the new mode register values specified by the latest MRS command. If the two sets of values compare (i.e., have the same value), then this logic activates the MRS_compare indicator signal 816 (e.g., sets the MRS_compare indicator signal 816 to one). The mode register shadow module 800 (also referred to as the mode register shadow logic) also includes MRS shadow register logic 806 that uses the MRS_shdw_upd indicator signal 812 to store the new mode register values detected on the incoming command bus, into the appropriate shadow register 806. In addition, the mode register shadow module also includes MRS shadow rank log logic 808 which uses the MRS_shdw_upd indicator signal 812 and MRS_compare indicator signal 816 as well as the MRS_rank indicator signals 814, or decode bits, to properly set or reset each bit in the shadow rank log 808 affected by the current operation.

Figure 9:
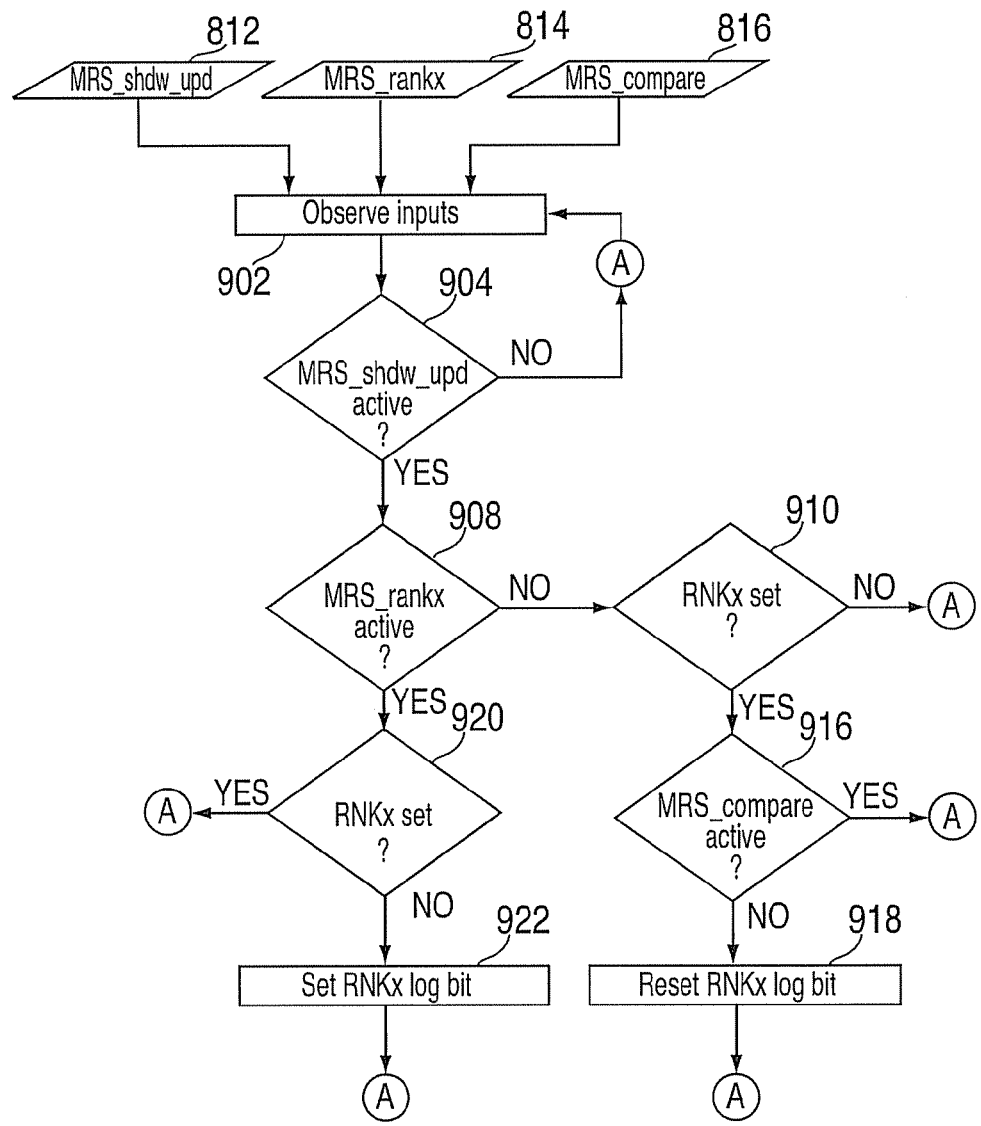
FIG. 9 is a process flow of a mode register shadow module with rank logging that may be implemented by an exemplary embodiment.

FIG. 9 is a process flow of mode register shadow logic with rank logging that may be implemented by an exemplary embodiment. The process flow in FIG. 9 applies for a given rank log bit, RNKx (where 'x' refers to one of two or more ranks of memory in the exemplary memory subsystem). Although only one process flow is shown, this exemplary embodiment would include multiple copies of the process flow, operating in parallel, with one assigned to each memory rank (e.g. RNKw, RNKy, RNKz, etc.) and with the term "x" replaced with the term "w", "y", "z", etc., based on the rank to which the process flow applies. Returning to the specific example in FIG. 9, at block 902, three input signals are monitored. The input signals include the MRS_shadow_upd indicator signal 812, the MRS_rank indicator signal 814, and the MRS_compare_indicator signal 816. At block 904, it is determined if the MRS_shadow_upd indicator signal 812 is active. If it is not active, then an MRS command to one of the memory rank(s) connected to hub 504 has not been detected by the mode register shadow logic and processing continues at block 902 with the three input signals being monitored.

If a MRS command has been received, as indicated by detecting an active MRS_shadow_upd indicator signal 812 at block 904, the block 908 is performed. The rank log bit in the shadow rank log 808 corresponding to rank x is referred to as the RNKx bit, and the RNKx bit identification is included in the information received in the address and/or command data from bus 506. Block 908 is performed to determine if the MRS_rank indicator signal 814 is active. If the MRS_rankx indicator signal 814 is active, then this indicates that the new MRS command applies to rank x. Block 920 is performed to determine if the bit for RNKx is set (e.g., equal to one) in the shadow rank log 808, indicating that the mode register for rank "x" was previously written. If it has already been set, then processing continues at block 902, with the specified inputs being monitored. If the RNKx bit is not set, as determined at block 920, then block 922 is performed to set the RNKx log bit in the shadow rank log 808. The setting of the log bit indicates that the value in the shadow register 806 is the same as the value written to the mode register on the memory device(s) associated with memory rank "x". Processing then continues at block 902, to monitor inputs. As described earlier, in parallel with the process flow for rank "x", identical process flows would take place for each of the other memory rank(s) attached to the MID 504, with the bit position assigned to the additional memory ranks also updated, if applicable, in the common rank log.

If it is determined at block 908, that MRS_rankx indicator signal 814 is not active (e.g., the current operation is related to a different memory rank, such as rank "w", "y" or "z" as described earlier) then block 910 is performed to determine if a mode register set command was previously decoded and forwarded to memory rank "x". If the log bit in the shadow rank log 808 has not been previously set, as determined at block 910, then processing continues at block 902. If the log bit in the shadow rank log 808 has been previously set, as determined at block 910, then block 916 is performed to determine if the current contents of the shadow register 806 match the new mode register values from the current command as indicated by the MRS_compare indicator signal 816. If it is determined, at block 916, that the MRS_compare indicator signal 816 is active (i.e., that the values are the same), then processing continues at block 902. If it is determined, at block 916, that the MRS_compare indicator signal 816 is not active (i.e., the values are different), then block 918 is performed to reset (e.g., to zero) the RNKx log bit in the shadow rank log 808. The reset log bit indicates that the current contents in the shadow register 806 are not the same as previous mode register contents sent to the memory devices at rank x. With the process flow in FIG. 9 applied to each of the memory ranks connected to MID 504, it is demonstrated that the MRS Shadow Register and MRS Shadow Rank Log will efficiently provide a means of both storing and verifying that all memory ranks have had their mode register(s) set and have been sent identical MRS information.

Figure 10:
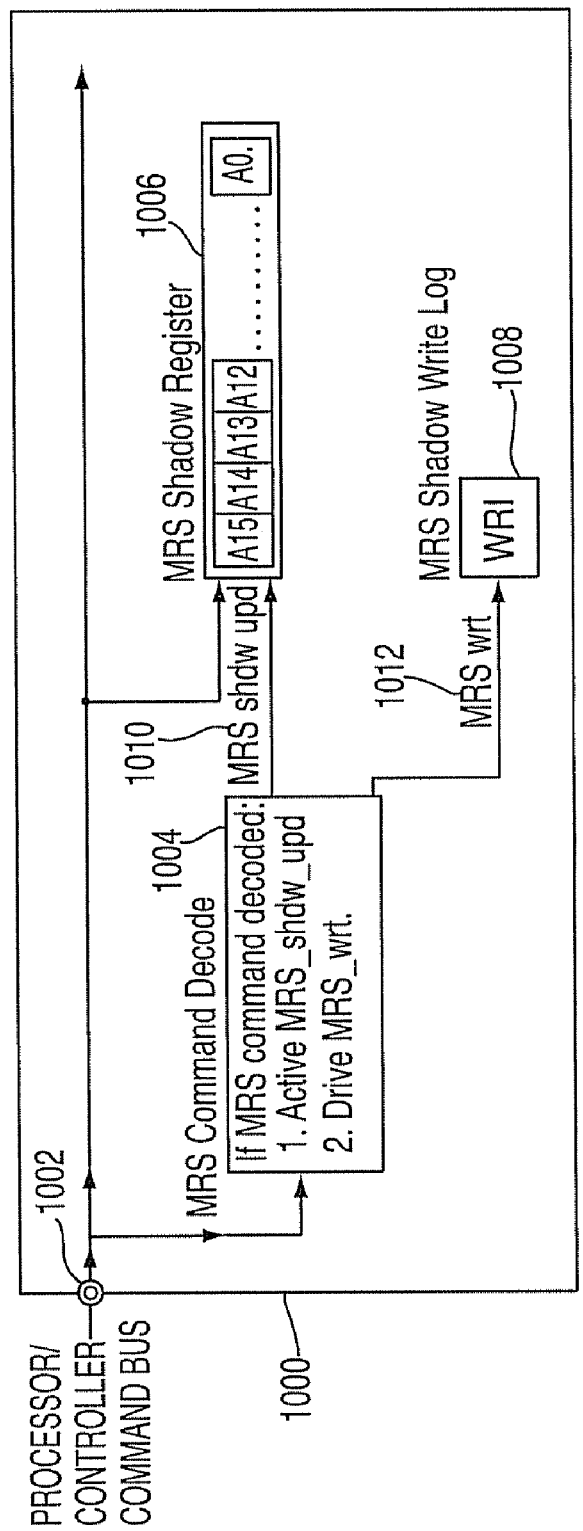
FIG. 10 is a block diagram of a mode register shadow module without rank logging that may be implemented by an exemplary embodiment.

FIG. 10 is a block diagram of mode register shadow module 1000 without rank logging that may be implemented by an exemplary embodiment. In this exemplary embodiment the MRS shadow register 1006 applies to one rank rather than to all ranks. There is a shadow register 1006 for each mode register for each rank, and therefore, there is no need for multiple rank logging. However, there is an accompanying shadow log 1008 containing a write bit that indicates both that the MRS command took place and that the contents of the shadow register 1006 should match the associated SDRAM mode register for that rank. As indicated in previous text, this method significantly increases the number of shadow registers required in a multi-rank memory subsystem, with the MID necessarily including a unique set of shadow registers for each of the maximum number of memory ranks supported by the interface device.

The mode register shadow logic includes MRS command decode logic 1004 to decode an MRS command received at an input port 1002 from the incoming processor/controller command bus from link interface 604, after the contents of the bus have been validated and/or corrected via a CRC/re-try, ECC or other validation and/or correction method, and activates an MRS_shdw_upd indicator signal 1010. This triggers the MRS shadow register 1006 to capture the mode register values in the MRS command. Additionally, the MRS command decode logic activates an MRS_wrt indicator signal 1012 that causes the MRS shadow write log bit in the shadow log 1008 to be set, indicating that that mode register has been set for that rank.

As will be evident to those skilled in the art, combinations of the exemplary embodiments may be used. For example, a four rank memory system, comprised of two, 2-rank memory modules connected together in a cascade interconnect system, might use the mode register shadow with rank logging configuration as shown in FIG. 8 for each of the 2-rank modules shown in FIG. 7. This would allow for reduced shadow register requirements (and the associated reduced power dissipation) while enabling the memory devices on the first 2-rank module to be configured with different mode register settings than the memory devices on the second 2-rank memory module—with the mode register settings captured in the two sets of MRS shadow registers. This configuration would be ideally suited for applications where the ranks on a first module are each configured with identical mode register settings, and the ranks on a second module are each configured with identical mode register settings that may differ from those on the first module. As shown in the embodiment of FIG. 7, the mode register shadow logic would reside on bus converter (or MID) 706.

In yet another exemplary embodiment, a portion of the system memory (e.g. 'y' ranks of 'z' total ranks, consisting of the system's "main memory") may be operated in a common manner, enabling the use of a space-efficient mode register shadow with rank logging—whereas the remainder of the memory ranks (ranks z-y) may be assigned to one or more specialized tasks (e.g. graphics, I/O, etc) that optimally operate with different mode register settings, thereby being better suited for the mode register shadow without rank logging structure and method. In an exemplary embodiment, a single hub device 504 would be connected to four ranks of memory devices, with each of the memory ranks programmed to optimally operate in the described applications, and assigned to one of the shadow register structures based on either a predefined or programmable means based on whether or not the programming of the mode register(s) for that rank will be consistent with one or more additional ranks.

Figure 11:
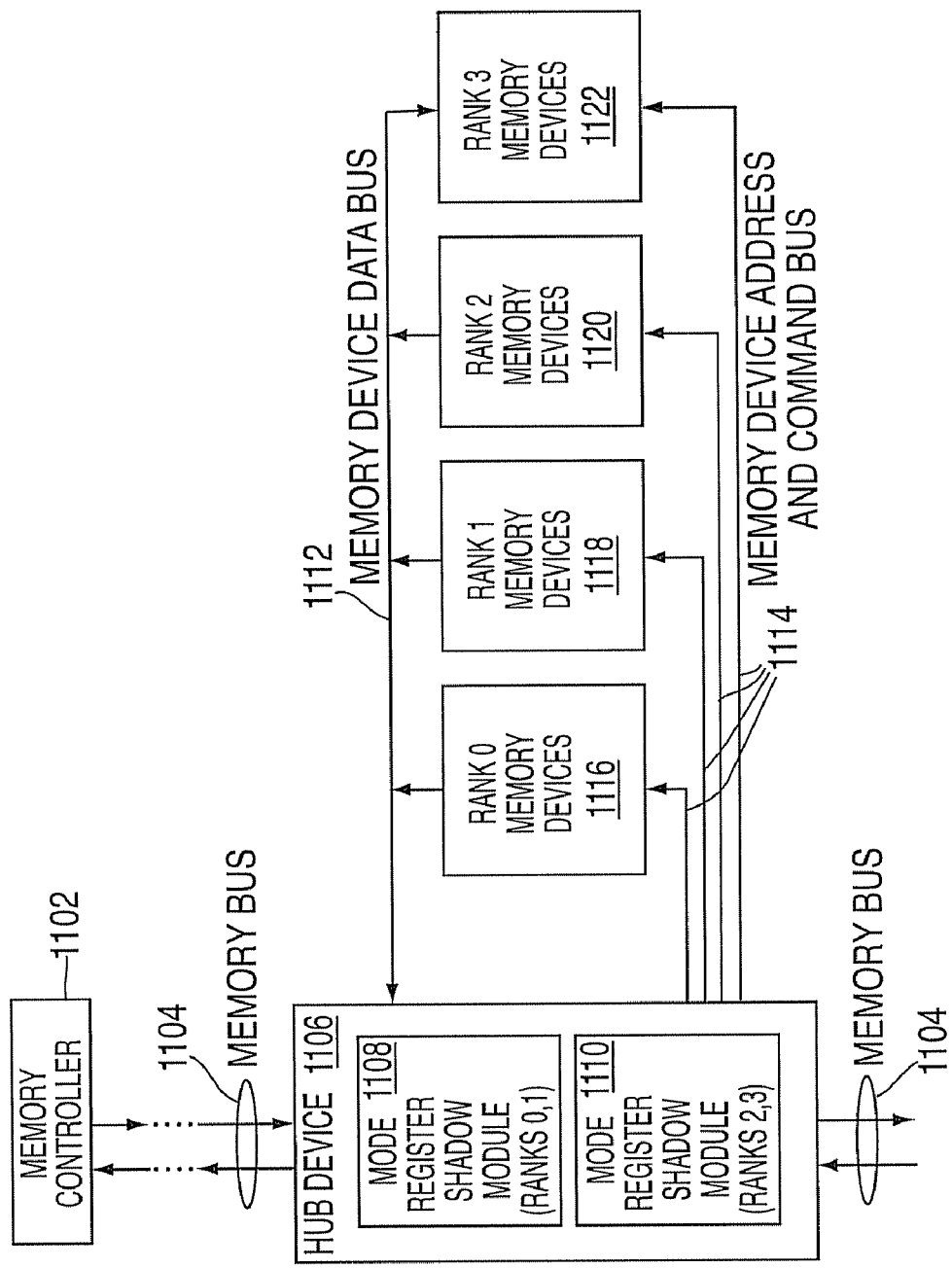
FIG. 11 is a block diagram of a memory subsystem configuration including a plurality of mode register shadow modules that may be implemented by an exemplary embodiment.

The configuration depicted in FIG. 11 may be utilized where mode registers in different ranks of memory connected to the same MID have different settings (e.g., because of different application requirements or different types of memory devices). FIG. 11 includes a hub device 1106 connected to a memory controller 1102 via a memory bus 1104. The hub device 1106 receives and decodes memory commands from the memory controller 1102 and is in communication with the memory devices via a memory device address and command bus 1114 and a memory device data bus 1112. The hub device 1106 in FIG. 11 includes a first mode register shadow module 1108 for shadowing the registers in Rank 0 1116 and Rank 1 1118. The hub device 1106 also includes a second mode register shadow module 1110 for shadowing the registers in Rank 2 1120 and Rank 3 1122. The first mode register shadow module 1108 may be configured with rank logging as depicted in FIG. 8 or without rank logging as depicted in FIG. 10 depending on application requirements. Similarly, the second mode register shadow module 1110 may be configured with rank logging or without rank logging. If further granularity and/or further grouping is required, additional mode register shadow modules may be added to the hub device 1106, and the rank assignments to the two or more mode register shadow modules may be determined during the power-up and/or configuration of the memory (sub-) system(s).

Information generally included in the SDRAM mode register(s) that should be programmed during memory initialization (and may be further modified during operation) include, but is not limited to, the following: CAS latency; burst length; additive latency; write recovery; burst sequence (type); DLL controls; Rtt setting selection; output drive impedance; write leveling; self refresh rate; dynamic ODT control and partial array self refresh (PASR).

The Rtt setting selection, output drive impedance, write leveling and other mode register settings may be optimized for a specific system based on testing done in the system environment, as part of the power-on-self-test and/or initialization sequences. In the exemplary embodiment, the shadow register captures the initial settings provided to the DRAM by the system (e.g. the memory controller), after which the buffer device, or MID uses these settings as a base and adjusts one or more of these settings up and down, in conjunction with the use of memory self-test logic (on the buffer, and well known in the art), to determine the optimal setting(s) for each parameter. Optimal settings may be determined using an algorithm such as one that locates the failing points for each parameter (at which point the write and read data do not match), and selecting the mid point between the fail points and setting the memory devices and shadow registers to this midpoint value. The memory controller would then determine the final (optimized) settings by performing a read operation to the affected shadow registers on the MID, after the self-test and configuration optimization is completed. This would offload the optimization process from the memory controller, and allow one or more ranks of memory, in the memory system, to be configured in parallel—thereby reducing system start-up delay. In exemplary embodiments, the memory controller would have the capability to enable or disable local interface optimization by the MID and would retain the capability to set the mode register(s) and MID configuration register(s) to known and/or pre-determined values.

In an alternate exemplary embodiment, the MID adjusts the mode register settings, for example in response to temperature changes local to the memory subsystem, for parameters affected by memory device temperatures (such as memory self refresh rate), based on either the MID temperature (detected on the MID, as is well known in the art) or based on temperature information provided to the MID by the memory device(s).

Other programming information that must be sent to the MID to allow the MID to properly operate in the memory subsystem, in addition to the mode register settings sent to the memory devices (and captured by the MID shadow registers) include, but are not limited to: reset MID; scan/flush MID; MID personalization (set internal registers to correct operating mode(s)); set memory interface timings; set MID drive strengths; define the number memory ranks connected; set the number of MID channels used; define which MID outputs used; and configure memory self-test circuitry.

A typical memory subsystem initialization sequence includes the following: 1) Reset MID; 2) Scan/flush MID; 3) Personalize the MID; 4) Reset DRAMs (via MID); 5) Place all DRAMs in standby; and 6) Complete DRAM Mode Register Set (shadow registers capturing mode register set information). In exemplary embodiments, the MID may also assume responsibility for setting mode registers of other memory ranks based on MID commands received from the memory controller.

As high speed interfaces often require periodic re-training and/or adjustments in response to drift and/or other factors, to ensure reliable communication, it is possible that the memory system, at some point during normal operation, may begin to experience communication faults—as identified via one or more of the fault-tolerant methods included in the memory system structure (such as CRC/re-try and/or ECC). In an exemplary embodiment, if some or all of the data faults are determined to be between the MID and one or more ranks of memory connected to the MID, the MID and/or memory device drivers, receivers, terminators, data capture timings or other parameters may be adjusted, consistent with a pre-programmed algorithm, in an effort to eliminate or dramatically reduce the faults. With the shadow register in the MID containing a copy of the DRAM mode register settings, the MID can either continue to operate as a slave device to the memory controller (capturing and logging new mode register settings while the memory controller adjusts the settings in the MID and/or memory devices) or operate as a local master, generally upon receiving a command from the memory controller to do so. Operating as a local master, for the duration of the self-test/adjustment period, the memory interface device would operate in the method described earlier to write and read test patterns while adjusting a portion of either or both the MID and memory device (mode register) settings to maximize the integrity of the memory to MID interface integrity. Upon completion of the self-test/adjustment period, the memory controller could read the shadow registers in the MID to determine the then-current mode register settings of the DRAMs.

Exemplary embodiments include a computing system with a processor(s) and an I/O unlit(s) (e.g., requesters) interconnected to a memory system that contains a memory controller and memory devices. In exemplary embodiments, the memory system includes a processor or memory controller interfaced to a set of hub devices (also referred to as "hub chips"). The hub devices connect and interface to the memory devices. In exemplary embodiments the computer memory system includes a physical memory array with a plurality of memory devices for storing data and instructions. These memory devices may be connected directly to the memory controller and/or indirectly coupled to the memory controller through hub devices. In exemplary embodiments, the hub-based computer memory system has memory devices attached to a communication hub device that is connected to a memory control device (e.g., a memory controller). Also in exemplary embodiments, the hub device is located on a memory module (e.g., a single substrate or physical device) that includes two or more hub devices that are cascaded interconnected to each other (and possibly to another hub device located on another memory module) via the memory bus.

Hub devices may be connected to the memory controller through a multi-drop or point-to-point bus structure (which may further include a cascade connection to one or more additional hub devices). Memory access requests are transmitted by the memory controller through the bus structure (e.g., the memory bus) to the selected hub(s). In response to receiving the memory access requests, the hub device translates the memory access requests to control the memory devices to store write data from the hub device or to provide read data to the hub device. Read data is encoded into one or more communication packet(s) and transmitted through the memory bus(ses) to the memory controller.

In alternate exemplary embodiments, the memory controller(s) may be integrated together with one or more processor chips and supporting logic, packaged in a discrete chip (commonly called a "northbridge" chip), included in a multi-chip carrier with the one or more processors and/or supporting logic, or packaged in various alternative forms that best match the application/environment. Ally of these solutions may or may not employ one or more narrow/high speed links to connect to one or more hub chips and/or memory devices.

The memory modules may be implemented by a variety of technology including a DIMM, a single in-line memory module (SIMM) and/or other memory module or card structures. In general, a DIMM refers to a small circuit board which is comprised primarily of random access memory (RAM) integrated circuits or die on one or both sides with signal and/or power pins on both sides of the board. This can be contrasted to a SIMM which is a small circuit board or substrate composed primarily of RAM integrated circuits or die on one or both sides and single row of pins along one long edge. The DIMM depicted in FIG. 1 includes 168 pins in the exemplary embodiment, whereas subsequent DIMMs have been constructed with pincounts ranging from 100 pins to over 300 pins. In exemplary embodiments described herein, memory modules may include two or more hub devices.

In exemplary embodiments, the memory bus is constructed using multi-drop connections to hub devices on the memory modules and/or using point-to-point connections. The downstream portion of the controller interface (or memory bus), referred to as the downstream bus, may include command, address, data and other operational, initialization or status information being sent to the hub devices on the memory modules. Each hub device may simply forward the information to the subsequent hub device(s) via bypass circuitry; receive, interpret and re-drive the information if it is determined to be targeting a downstream hub device; re-drive some or all of the information without first interpreting the information to determine the intended recipient; or perform a subset or combination of these options.

The upstream portion of the memory bus, referred to as the upstream bus, returns requested read data and/or error, status or other operational information, and this information may be forwarded to the subsequent hub devices via bypass circuitry; be received, interpreted and re-driven if it is determined to be targeting an upstream hub device and/or memory controller in the processor complex; be re-driven in part or in total without first interpreting the information to determine the intended recipient; or perform a subset or combination of these options.

In alternate exemplary embodiments, the point-to-point bus includes a switch or bypass mechanism which results in the bus information being directed to one of two or more possible hub devices during downstream communication (communication passing from the memory controller to a hub device on a memory module), as well as directing upstream information (communication from a hub device on a memory module to the memory controller), often by way of one or more upstream hub devices. Further embodiments include the use of continuity modules, such as those recognized in the art, which, for example, can be placed between the memory controller and a first populated hub device (i.e., a hub device that is in communication with one or more memory devices), in a cascade interconnect memory system, such that any intermediate hub device positions between the memory controller and the first populated hub device include a means by which information passing between the memory controller and the first populated hub device can be received even if the one or more intermediate hub device position(s) do not include a hub device. The continuity module(s) may be installed in any module position(s), subject to any bus restrictions, including the first position (closest to the main memory controller, the last position (prior to any included termination) or any intermediate position(s). The use of continuity modules may be especially beneficial in a multi-module cascade interconnect bus structure, where an intermediate hub device on a memory module is removed and replaced by a continuity module, such that the system continues to operate after the removal of the intermediate hub device. In more common embodiments, the continuity module(s) would include either interconnect wires to transfer all required signals from the input(s) to the corresponding output(s), or be re-driven through a repeater device. The continuity module(s) might further include a non-volatile storage device (such as an EEPROM), but would not include main memory storage devices.

In exemplary embodiments, the memory system includes one or more hub devices on one or more memory modules connected to the memory controller via a cascade interconnect memory bus, however other memory structures may be implemented such as a point-to-point bus, a multi-drop memory bus or a shared bus. Depending on the signaling methods used, the target operating frequencies, space, power, cost, and other constraints, various alternate bus structures may be considered. A point-to-point bus may provide the optimal performance in systems produced with electrical interconnections, due to the reduced signal degradation that may occur as compared to bus structures having branched signal lines, switch devices, or stubs. However, when used in systems requiring communication with multiple devices or subsystems, this method will often result in significant added component cost and increased system power, and may reduce the potential memory density due to the need for intermediate buffering and/or re-drive.

Although not shown in the Figures, the memory modules or hub devices may also include a separate bus, such as a 'presence detect' bus, an I2C bus and/or an SMBus which is used for one or more purposes including the determination of the hub device an/or memory module attributes (generally after power-up), the reporting of fault or status information to the system, the configuration of the hub device(s) and/or memory subsystem(s) after power-up or during normal operation or other purposes. Depending on the bus characteristics, this bus might also provide a means by which the valid completion of operations could be reported by the hub devices and/or memory module(s) to the memory controller(s), or the identification of failures occurring during the execution of the main memory controller requests.

Performances similar to those obtained from point-to-point bus structures can be obtained by adding switch devices. These and other solutions offer increased memory packaging density at lower power, while retaining many of the characteristics of a point-to-point bus. Multi-drop busses provide an alternate solution, albeit often limited to a lower operating frequency, but at a cost/performance point that may be advantageous for many applications. Optical bus solutions permit significantly increased frequency and bandwidth potential, either in point-to-point or multi-drop applications, but may incur cost and space impacts.

As used herein the term "buffer" or "buffer device" refers to a temporary storage unit (as in a computer), especially one that accepts information at one rate and delivers it another. In exemplary embodiments, a buffer is an electronic device that provides compatibility between two signals (e.g., changing voltage levels or current capability). The term "hub" is sometimes used interchangeably with the term "buffer." A hub is a device containing multiple ports that is connected to several other devices. A port is a portion of an interface that serves a congruent I/O functionality (e.g., a port may be utilized for sending and receiving data, address, and control information over one of the point-to-point links, or busses). A hub may be a central device that connects several systems, subsystems, or networks together. A passive hub may simply forward messages, while an active hub, or repeater, amplifies and refreshes the stream of data which otherwise would deteriorate over a distance. The term hub device, as used herein, refers to a hub chip that includes logic (hardware and/or software) for performing memory functions.

Also as used herein, the term "bus" refers to one of the sets of conductors (e.g., wires, and printed circuit board traces or connections in an integrated circuit) connecting two or more functional units in a computer. The data bus, address bus and control signals, despite their names, constitute a single bus since each are often useless without the others. A bus may include a plurality of signal lines, each signal line having two or more connection points, that form a main transmission path that electrically connects two or more transceivers, transmitters and/or receivers. The term "bus" is contrasted with the term "channel" which is often used to describe the function of a "port" as related to a memory controller in a memory system, and which may include one or more busses or sets of busses. The term "channel" as used herein refers to a port on a memory controller. Note that this term is often used in conjunction with I/O or other peripheral equipment, however the term channel has been adopted by some to describe the interface between a processor or memory controller and one of one or more memory subsystem(s).

Further, as used herein, the term "daisy chain" refers to a bus wiring structure in which, for example, device A is wired to device B, device B is wired to device C, etc. The last device is typically wired to a resistor or terminator. All devices may receive identical signals or, in contrast to a simple bus, each device may modify one or more signals before passing them on. A "cascade" or cascade interconnect' as used herein refers to a succession of stages or units or a collection of interconnected networking devices, typically hubs, in which the hubs operate as a logical repeater, further permitting merging data to be concentrated into the existing data stream. Also as used herein, the term "point-to-point" bus and/or link refers to one or a plurality of signal lines that may each include one or more terminators. In a point-to-point bus and/or link, each signal line has two transceiver connection points, with each transceiver connection point coupled to transmitter circuitry, receiver circuitry or transceiver circuitry. A signal line refers to one or more electrical conductors or optical carriers, generally configured as a single carrier or as two or more carriers, in a twisted, parallel, or concentric arrangement, used to transport at least one logical signal.

Memory devices are generally defined as integrated circuits that are composed primarily of memory (storage) cells, such as DRAMs (Dynamic Random Access Memories), SRAMs (Static Random Access Memories), FeRAMs (Ferro-Electric RAMs), MRAMs (Magnetic Random Access Memories), Flash Memory and other forms of random access and related memories that store information in the form of electrical, optical, magnetic, biological or other means. Dynamic memory device types may include asynchronous memory devices such as FPM DRAMs (Fast Page Mode Dynamic Random Access Memories), EDO (Extended Data Out) DRAMs, BEDO (Burst EDO) DRAMs, SDR (Single Data Rate) Synchronous DRAMs, DDR (Double Data Rate) Synchronous DRAMs or any of the expected follow-on devices such as DDR2, DDR3, DDR4 and related technologies such as Graphics RAMs, Video RAMs, LP RAM (Low Power DRAMs) which are often based on the fundamental functions, features and/or interfaces found on related DRAMs.

Memory devices may be utilized in the form of chips (die) and/or single or multi-chip packages of various types and configurations. In multi-chip packages, the memory devices may be packaged with other device types such as other memory devices, logic chips, analog devices and programmable devices, and may also include passive devices such as resistors, capacitors and inductors. These packages may include an integrated heat sink or other cooling enhancements, which may be further attached to the immediate carrier or another nearby carrier or heat removal system.

Module support devices (such as buffers, hubs, hub logic chips, registers, PLL's, DLL's, non-volatile memory, etc) may be comprised of multiple separate chips and/or components, may be combined as multiple separate chips onto one or more substrates, may be combined onto a single package or even integrated onto a single device—based on technology, power, space, cost and other tradeoffs. In addition, one or more of the various passive devices such as resistors, capacitors may be integrated into the support chip packages, or into the substrate, board or raw card itself, based on technology, power, space, cost and other tradeoffs. These packages may include all integrated heat sink or other cooling enhancements, which may be further attached to the immediate carrier or another nearby carrier or heat removal system.

Memory devices, hubs, buffers, registers, clock devices, passives and other memory support devices and/or components may be attached to the memory subsystem and/or hub device via various methods including solder interconnects, conductive adhesives, socket structures, pressure contacts and other methods which enable communication between the two or more devices via electrical, optical or alternate means.

The one or more memory modules (or memory subsystems) and/or hub devices may be connected to the memory system, processor complex, computer system or other system environment via one or more methods such as soldered interconnects, connectors, pressure contacts, conductive adhesives, optical interconnects and other communication and power delivery methods. Connector systems may include mating connectors (male/female), conductive contacts and/or pins on one carrier mating with a male or female connector, optical connections, pressure contacts (often in conjunction with a retaining mechanism) and/or one or more of various other communication and power delivery methods. The interconnection(s) may be disposed along one or more edges of the memory assembly and/or placed a distance from an edge of the memory subsystem depending on such application requirements as ease-of-upgrade/repair, available space/volume, heat transfer, component size and shape and other related physical, electrical, optical, visual/physical access, etc.

As used herein, the term memory subsystem refers to, but is not limited to: one or more memory devices; one or more memory devices and associated interface and/or timing/control circuitry; and/or one or more memory devices in conjunction with a memory buffer, hub device, and/or switch. The term memory subsystem may also refer to one or more memory devices, in addition to any associated interface and/or timing/control circuitry and/or a memory buffer, hub device or switch, assembled into a substrate, a card, a module or related assembly, which may also include a connector or similar means of electrically attaching the memory subsystem with other circuitry. The memory modules described herein may also be referred to as memory subsystems because they include one or more memory devices and hub devices Additional functions that may reside local to the memory subsystem and/or hub device include write and/or read buffers, one or more levels of memory cache, local pre-fetch logic, data encryption/decryption, compression/decompression, protocol translation, command prioritization logic, voltage and/or level translation, error detection and/or correction circuitry, data scrubbing, local power management circuitry and/or repotting, operational and/or status registers, initialization circuitry, performance monitoring and/or control, one or more co-processors, search engine(s) and other functions that may have previously resided in other memory subsystems. By placing a function local to the memory subsystem, added performance may be obtained as related to the specific function, often while making use of unused circuits within the subsystem.

Memory subsystem support device(s) may be directly attached to the same substrate or assembly onto which the memory device(s) are attached, or may be mounted to a separate interposer or substrate also produced using one or more of various plastic, silicon, ceramic or other materials which include electrical, optical or other communication paths to functionally interconnect the support device(s) to the memory device(s) and/or to other elements of the memory or computer system.

Information transfers (e.g. packets) along a bus, channel, link or other naming convention applied to an interconnection method may be completed using one or more of many signaling options. These signaling options may include such methods as single-ended, differential, optical or other approaches, with electrical signaling further including such methods as voltage or current signaling using either single or multi-level approaches. Signals may also be modulated using such methods as time or frequency, non-return to zero, phase shift keying, amplitude modulation and others. Voltage levels are expected to continue to decrease, with 1.5V, 1.2V, 1V and lower signal voltages expected consistent with (but often independent of) the reduced power supply voltages required for the operation of the associated integrated circuits themselves.

One or more clocking methods may be utilized within the memory subsystem and the memory system itself, including global clocking, source-synchronous clocking, encoded clocking or combinations of these and other methods. The clock signaling may be identical to that of the signal lines themselves, or may utilize one of the listed or alternate methods that is more conducive to the planned clock frequency(ies), and the number of clocks planned within the various subsystems. A single clock may be associated with all communication to and from the memory, as well as all clocked functions within the memory subsystem, or multiple clocks may be sourced using one or more methods such as those described earlier. When multiple clocks are used, the functions within the memory subsystem may be associated with a clock that is uniquely sourced to the subsystem, or may be based on a clock that is derived from the clock related to the information being transferred to and from the memory subsystem (such as that associated with an encoded clock). Alternately, a unique clock may be used for the information transferred to the memory subsystem, and a separate clock for information sourced from one (or more) of the memory subsystems. The clocks themselves may operate at the same or frequency multiple of the communication or functional frequency, and may be edge-aligned, center-aligned or placed in an alternate timing position relative to the data, command or address information.

Information passing to the memory subsystem(s) will generally be composed of address, command and data, as well as other signals generally associated with requesting or reporting status or error conditions, resetting the memory, completing memory or logic initialization and other functional, configuration or related information. Information passing from the memory subsystem(s) may include any or all of the information passing to the memory subsystem(s), however generally will not include address and command information. This information may be communicated using communication methods that may be consistent with normal memory device interface specifications (generally parallel in nature), the information may be encoded into a 'packet' structure, which may be consistent with future memory interfaces or simply developed to increase communication bandwidth and/or enable the subsystem to operate independently of the memory technology by converting the received information into the format required by the receiving device(s).

Initialization of the memory subsystem may be completed via one or more methods, based on the available interface busses, the desired initialization speed, available space, cost/complexity objectives, subsystem interconnect structures, the use of alternate processors (such as a service processor) which may be used for this and other purposes, etc. In one embodiment, the high speed bus may be used to complete the initialization of the memory subsystem(s), generally by first completing a training process to establish reliable communication, then by interrogation of the attribute or 'presence detect' data associated the various components and/or characteristics associated with that subsystem, and ultimately by programming the appropriate devices with information associated with the intended operation within that system. In a cascaded system, communication with the first memory subsystem would generally be established, followed by subsequent (downstream) subsystems in the sequence consistent with their position along the cascade interconnect bus.

A second initialization method would include one in which the high speed bus is operated at one frequency during the initialization process, then at a second (and generally higher) frequency during the normal operation. In this embodiment, it may be possible to initiate communication with all of the memory subsystems on the cascade interconnect bus prior to completing the interrogation and/or programming of each subsystem, due to the increased timing margins associated with the lower frequency operation.

A third initialization method might include operation of the cascade interconnect bus at the normal operational frequency(ies), while increasing the number of cycles associated with each address, command and/or data transfer. In one embodiment, a packet containing all or a portion of the address, command and/or data information might be transferred in one clock cycle during normal operation, but the same amount and/or type of information might be transferred over two, three or more cycles during initialization. This initialization process would therefore be using a form of 'slow' commands, rather than 'normal' commands, and this mode might be automatically entered at some point after power-up and/or re-start by each of the subsystems and the memory controller by way of POR (power-on-reset) logic included in each of these subsystems.

A fourth initialization method might utilize a distinct bus, such as a presence detect bus (such as the one defined in U.S. Pat. No. 5,513,135 to Dell et al., of common assignment herewith), an I2C bus (such as defined in published JEDEC standards such as the 168 Pin DIMM family in publication 21-C revision 7R8) and/or the SMBUS, which has been widely utilized and documented in computer systems using such memory modules. This bus might be connected to one or more modules within a memory system in a daisy chain/ cascade interconnect, multi-drop or alternate structure, providing an independent means of interrogating memory subsystems, programming each of the one or more memory subsystems to operate within the overall system environment, and adjusting the operational characteristics at other times during the normal system operation based on performance, thermal, configuration or other changes desired or detected in the system environment.

Other methods for initialization can also be used, in conjunction with or independent of those listed. The use of a separate bus, such as described in the fourth embodiment above, also offers the advantage of providing an independent means for both initialization and uses other than initialization, such as described in U.S. Pat. No. 6,381,685 to Dell et al., of common assignment herewith, including changes to the subsystem operational characteristics on-the-fly and for the reporting of and response to operational subsystem information such as utilization, temperature data, failure information or other purposes.

With improvements in lithography, better process controls, the use of materials with lower resistance, increased field sizes and other semiconductor processing improvements, increased device circuit density (often in conjunction with increased die sizes) will help facilitate increased function on integrated devices as well as the integration of functions previously implemented on separate devices. This integration will serve to improve overall performance of the intended function, as well as promote increased storage density, reduced power, reduced space requirements, lower cost and other manufacturer and customer benefits. This integration is a natural evolutionary process, and may result in the need for structural changes to the fundamental building blocks associated with systems.

The integrity of the communication path, the data storage contents and all functional operations associated with each element of a memory system or subsystem can be assured, to a high degree, with the use of one or more fault detection and/or correction methods. Any or all of the various elements may include error detection and/or correction methods such as CRC (Cyclic Redundancy Code), EDC (Error Detection and Correction), parity or other encoding/decoding methods suited for this purpose. Further reliability enhancements may include operation re-try (to overcome intermittent faults such as those associated with the transfer of information), the use of one or more alternate or replacement communication paths to replace failing paths and/or lines, complement-re-complement techniques or alternate methods used in computer, communication and related systems.

The use of bus termination, on busses as simple as point-to-point links or as complex as multi-drop structures, is becoming more common consistent with increased performance demands. A wide variety of termination methods can be identified and/or considered, and include the use of such devices as resistors, capacitors, inductors or any combination thereof, with these devices connected between the signal line and a power supply voltage or ground, a termination voltage or another signal. The termination device(s) may be part of a passive or active termination structure, and may reside in one or more positions along one or more of the signal lines, and/or as part of the transmitter and/or receiving device(s). The terminator may be selected to match the impedance of the transmission line, or selected via an alternate approach to maximize the useable frequency, operating margins and related attributes within the cost, space, power and other constraints.

Technical effects and benefits of include serviceability improvements during system test and field test by providing the ability to trap the contents of the mode registers, thus knowing the contents of the mode registers with a relatively high degree of certainty. This may lead to a decreased in time required to debug system problems. In addition, MIDs may be able to direct the training of the memory devices (e.g., timings, drive strengths, termination, etc.). Currently the training is performed in response to commands from the memory controller/system. Having the MIDs perform this function may lead to lower utilization of the memory bus. In addition, several MIDs in a memory system could perform the training in parallel, resulting in a shorter overall elapsed time for the training.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. A memory interface device adapted for use in a memory system, the memory interface device comprising:
    an interface to one or more ranks of memory devices, each memory device including one or more types of mode registers;
    an interface to a memory bus for receiving commands from a memory controller, the commands including a mode register set command specifying a new mode register setting for one or more ranks of memory devices and a mode register type; and
    a mode register shadow module to capture settings applied to the mode registers, the module including a shadow register for each type of mode register and a shadow log for each type of mode register, and mode register shadow logic to detect a mode register set command, to store the new mode register setting in the shadow register corresponding to the specified mode register type, and to set one or more bits in the shadow log corresponding to the specified mode register type to indicate which of the ranks of memory devices have been programmed with the new mode register setting.

2. The memory interface device of claim 1 wherein each shadow log includes one bit for each of the ranks and each shadow register is the same size as its corresponding mode register.

3. The memory interface device of claim 1 wherein the memory interface device interfaces to one rank of memory devices and each of the shadow logs include one bit.

4. The memory interface device of claim 1 wherein the memory interface device further comprises memory device dependent logic that is programmed in response to the mode register set command.

5. The memory interface device of claim 1 wherein the memory interface device further comprises memory device dependent logic that is programmed in response to the contents of the shadow registers and the shadow logs.

6. The memory interface device of claim 1 wherein the memory interface device initiates a mode register set command directed to one or more of the ranks of memory devices.

7. The memory interface device of claim 1 wherein there are two or more ranks of memory devices and the memory interface device writes the new mode register setting to the mode registers of the specified type on the memory devices in the one or more ranks not specified by the mode register set command.

8. The memory interface device of claim 1 wherein the interface to the one or more ranks of memory devices is via an unbuffered memory module.

9. The memory interface device of claim 1 wherein the interface to the one or more ranks of memory devices is via a registered memory module.

10. The memory interface device of claim 1 wherein the memory interface device is located on a buffered memory module and the interface to the one or more ranks of memory devices is via a parallel bus.

11. A method for providing mode register shadowing at a memory interface device that interfaces to one or more ranks of memory devices, each memory device including one or more types of mode registers, the method comprising:
    detecting a mode register set command, the mode register set command specifying a new mode register setting, one of the ranks of memory devices and one of the mode register types;
    storing the new mode register setting in a shadow register corresponding to the mode register type;
    setting one or more bits in a shadow log corresponding to the mode register type to indicate which of the ranks of memory devices have been programmed with the new mode register setting.

12. The method of claim 11 further comprising programming memory device dependent logic in the memory interface device in response to the mode register set command.

13. The method of claim 11 wherein the memory interface device interfaces to two or more ranks of memory and the method further comprises writing the new mode register setting to the mode registers of the specified type on the memory devices in the one or more ranks not specified by the mode register set command.

14. A memory system for storing and retrieving data, the memory system comprising:
    one or more ranks of memory devices, each memory device including one or more types of mode registers;
    a memory controller for generating memory commands, the commands including a mode register set command specifying a mode register type and a new mode register setting for memory devices in a specified rank;
    a memory bus in communication with the memory controller; and
    a memory hub device comprising:
        an interface to the one or more ranks of memory devices;
        an interface to the memory bus for receiving the commands from the memory controller; and
        a mode register shadow module to track settings applied to the mode registers, the module including a shadow register for each type of mode register and a shadow log for each type of mode register, and mode register shadow logic to detect a mode register set command, to store the new mode register setting in the shadow register corresponding to the specified type, and to set one or more bits in the shadow log corresponding to the specified mode register type to indicate which of the ranks of memory devices have been programmed with the new mode register setting.

15. The memory system of claim 14 wherein the hub device includes a unique shadow register, corresponding to the mode register type, for each of the one or more memory ranks.

16. The memory system of claim 14 wherein each shadow register is the same size as its corresponding mode register.

17. The memory system of claim 14 wherein the memory controller reads the contents of one or more of the shadow registers and the shadow logs to determine if the mode register set commands have been processed.

18. The memory system of claim 14 wherein the memory interface device interface to the to the one or more ranks of memory devices is via one or more of an unbuffered memory module and a registered memory module.

19. A memory subsystem comprising:
one or more ranks of memory devices, each memory device including one or more types of mode registers;
a memory bus for receiving commands from a memory controller, the commands including a mode register set command specifying a mode register type and a new mode register setting for memory devices in a specified rank;
a memory hub device comprising:
  an interface to the one or more ranks of memory devices and to the memory bus; and
  a mode register shadow module to capture settings applied to the mode registers, the module including a shadow register for each type of mode register and a shadow log for each type of mode register, and mode register shadow logic to detect a mode register set command received on the memory bus, to store the new mode register setting in the shadow register corresponding to the specified mode register type, and to set one or more bits in the shadow log corresponding to the specified mode register type to indicate which of the ranks of memory devices have been programmed with the new mode register setting.

20. The memory subsystem of claim 19 wherein the hub device further comprises memory device dependent logic that is programmed in response to the mode register set command.

* * * * *